United States Patent
Roberts et al.

(10) Patent No.: US 9,983,240 B2
(45) Date of Patent: May 29, 2018

(54) SENSING MOTOR CURRENT

(71) Applicant: CAMBRIDGE MEDICAL ROBOTICS LIMITED, Cambridge (GB)

(72) Inventors: Paul Christopher Roberts, Cambridge (GB); Luke David Ronald Hares, Cambridge (GB)

(73) Assignee: CMR SURGICAL LIMITED, Cambridge (GB)

( * ) Notice: Subject to any disclaimer, the term of this patent is extended or adjusted under 35 U.S.C. 154(b) by 224 days.

(21) Appl. No.: 15/157,983

(22) Filed: May 18, 2016

(65) Prior Publication Data
US 2016/0341772 A1 Nov. 24, 2016

(30) Foreign Application Priority Data

May 19, 2015 (GB) .................... 1508583.0

(51) Int. Cl.
*G01R 1/44* (2006.01)
*G01R 19/32* (2006.01)
*G01R 35/00* (2006.01)
*G01R 19/00* (2006.01)
*G01R 15/20* (2006.01)

(52) U.S. Cl.
CPC ......... *G01R 19/32* (2013.01); *G01R 19/0007* (2013.01); *G01R 35/005* (2013.01); *G01R 15/202* (2013.01)

(58) Field of Classification Search
CPC .... G01R 1/20; G01R 1/22; G01P 3/44; G01P 3/46; G01P 3/48; G01P 3/487; G05D 3/127

See application file for complete search history.

(56) References Cited

U.S. PATENT DOCUMENTS

| 6,271,637 B1* | 8/2001 | Kushion | ............. B62D 5/0487 318/433 |
| 2009/0001964 A1 | 1/2009 | Strzalkowski | |
| 2009/0189553 A1* | 7/2009 | Arnet | ................. H02P 21/0035 318/400.3 |

FOREIGN PATENT DOCUMENTS

EP    2884297 A1    6/2015

OTHER PUBLICATIONS

United Kingdom Search Report from corresponding United Kingdom Application No. GB1508583.0 dated Nov. 2, 2015.

\* cited by examiner

*Primary Examiner* — Tung X Nguyen
(74) *Attorney, Agent, or Firm* — Lando & Anastasi, LLP

(57) ABSTRACT

A circuit configured to sense the driving current of a motor, the circuit comprising: a driver configured to generate a driving current for a motor; a first current sensor configured to sense the driving current thereby forming a first sensed current; a second current sensor configured to sense the driving current thereby forming a second sensed current, the second current sensor being more thermally stable than the first current sensor; a comparator configured to compare the first sensed current and the second sensed current below a threshold frequency to generate a thermal calibration output; and a calibrator configured to calibrate the first sensed current by the thermal calibration output to form a sensed driving current.

20 Claims, 3 Drawing Sheets

SENSING MOTOR CURRENT

CROSS-REFERENCE TO RELATED APPLICATION

This application claims the benefit under 35 U.S.C. §119 of United Kingdom Patent Application No. 1508583.0 filed on May 19, 2015 which is hereby incorporated herein by reference in its entirety for all purposes.

BACKGROUND

In systems which are controlled by a motor, it is desirable to accurately sense the current that is being driven through the motor. Typically, the current along with several other parameters is monitored and input to a feedback control loop which refines the operation of the motor. For example, in a DC motor, the current, shaft position, speed and direction of the rotating motor may all be measured, and those measurements input to a motor control circuit, which forms control inputs to the driver to adjust the operation of the motor.

In small, lightweight devices, it is desirable for the footprint of the current sensor to be as small as possible, and the weight of the current sensor to be minimised. It is also desirable for the current sensor to sense current without dissipating any of that current. A Hall sensor is a magnetic current sensor which is activated by an external magnetic field acting on it. It is thus able to provide a non-intrusive measurement of the current being driven through a motor by detecting the magnetic field generated by the current flow. It is also available packaged into a small IC. The Hall sensor produces an output voltage which varies as a function of the magnetic field density around it. Hence, by measuring the output voltage of a Hall sensor located in close proximity to the path of the driver output, the driving current of the motor is determined.

However, Hall sensors which are available packaged into a small IC suffer from the problem that their operation is very sensitive to their thermal surroundings. They are very accurate at measuring current in a narrow temperature window. However, outside of that narrow temperature window, their accuracy drops. As a motor is driven, the circuit boards on which the motor and the Hall sensor are located increase in temperature to levels outside of the narrow temperature window at which the Hall sensor provides an accurate current measurement. A typical circuit board on which the motor is driven can be expected to vary in temperature during operation from 15° C. to 60° C.

Large Hall sensors are available that are more temperature stable than the small Hall sensors discussed above, however these are not suitable for small, lightweight applications.

It would be possible to fully characterise the temperature characteristics of the circuit board and the Hall sensor during manufacture. Then the Hall sensor readings could be dynamically adjusted during operation to account for the current temperature of the circuit board. However, this would increase the time, complexity and cost of manufacturing the motor circuit.

SUMMARY OF THE INVENTION

According to an aspect of the invention, there is provided a circuit for sensing the driving current of a motor, the circuit comprising: a driver configured to generate a driving current for a motor; a first current sensor configured to sense the driving current thereby forming a first sensed current; a second current sensor configured to sense the driving current thereby forming a second sensed current, the second current sensor being more thermally stable than the first current sensor; a comparator configured to compare the first sensed current and the second sensed current below a threshold frequency to generate a thermal calibration output; and a calibrator configured to calibrate the first sensed current by the thermal calibration output to form a sensed driving current.

Suitably, the driver is configured to generate the driving current in response to a control input, wherein the control input is the sensed driving current.

The first current sensor may have a higher operational frequency bandwidth than the second current sensor.

Suitably, the driving current frequency range is within the operational frequency range of the first current sensor and outside the operational frequency range of the second current sensor.

Suitably, the circuit further comprises: a first low pass filter configured to attenuate frequencies above the threshold frequency to form a filtered first sensed current; and a second low pass filter configured to attenuate frequencies above the threshold frequency to form a filtered second sensed current; wherein the comparator is configured to compare the filtered first sensed current and the filtered second sensed current to generate the thermal calibration output.

The threshold frequency may be 10 Hz.

The thermal calibration output may be a linear offset, and the calibrator may be configured to calibrate the first sensed current by adding the linear offset to the first sensed current to form the sensed driving current.

The circuit may further comprise a fault detector configured to: compare the thermal calibration output to a predetermined threshold; and generate a fault signal if the thermal calibration output is greater than the predetermined threshold.

Suitably, the second current sensor is a current sense resistor.

The current sense resistor may comprise: a shunt resistor connected between the driver and the motor; and a differential amplifier connected across the shunt resistor, the differential amplifier configured to generate a differential mode signal proportional to the driving current.

The current sense resistor may further comprise a third low pass filter connected between the shunt resistor and the differential amplifier, the third low pass filter configured to attenuate components common to the inputs to the differential amplifier.

The third low pass filter may comprise a common-mode choke.

The third low pass filter may further comprise a shunt capacitor which connects the common-mode choke to ground.

Suitably, the first current sensor is a Hall sensor.

According to a second aspect of the invention, there is provided a method of sensing the driving current of a motor comprising: at a driver, generating a driving current for a motor; at a first current sensor, sensing the driving current thereby forming a first sensed current; at a second current sensor, sensing the driving current thereby forming a second sensed current, wherein the second current sensor is more thermally stable than the first current sensor; generating a thermal calibration output by comparing the first sensed current and the second sensed current below a threshold frequency; calibrating the first sensed current by the thermal calibration output to form a sensed driving current.

BRIEF DESCRIPTION OF THE FIGURES

The present invention will now be described by way of example with reference to the accompanying drawings. In the drawings.

DETAILED DESCRIPTION

The current being driven through a motor depends on the particular application. For example, it depends on the components that the motor is configured to drive. In many applications, the driving current varies significantly in magnitude, and may be very high. For example, the current may be up to 100 Å. The driving current may also have a large frequency bandwidth, and may have a very high frequency. For example, the bandwidth may be ~50 kHz. Thus, the circuitry used to sense the current is usefully sensitive over a large frequency bandwidth and able to accurately detect high currents. In addition, the circuitry usefully has a small footprint and is able to generate a current measurement in a non-intrusive manner. Hall sensors are able to measure high magnitude and high frequency currents in a non-intrusive way over a small footprint. However, as discussed above, they have poor thermal stability. This leads to large systematic errors in their current measurements as their ambient temperature deviates from the small temperature window over which their performance is stable.

The following describes circuitry in which the driving current of a motor as sensed by a first current sensor is calibrated using the driving current of the motor as sensed by a second current sensor which is more thermally stable than the first. In the examples that follow, the first current sensor is a Hall sensor. However, the principles discussed apply to other pairs of current sensors, wherein the second current sensor provides accurate current measurements at temperatures outside of the temperature window in which the first current sensor provides accurate current measurements.

Figure 1:
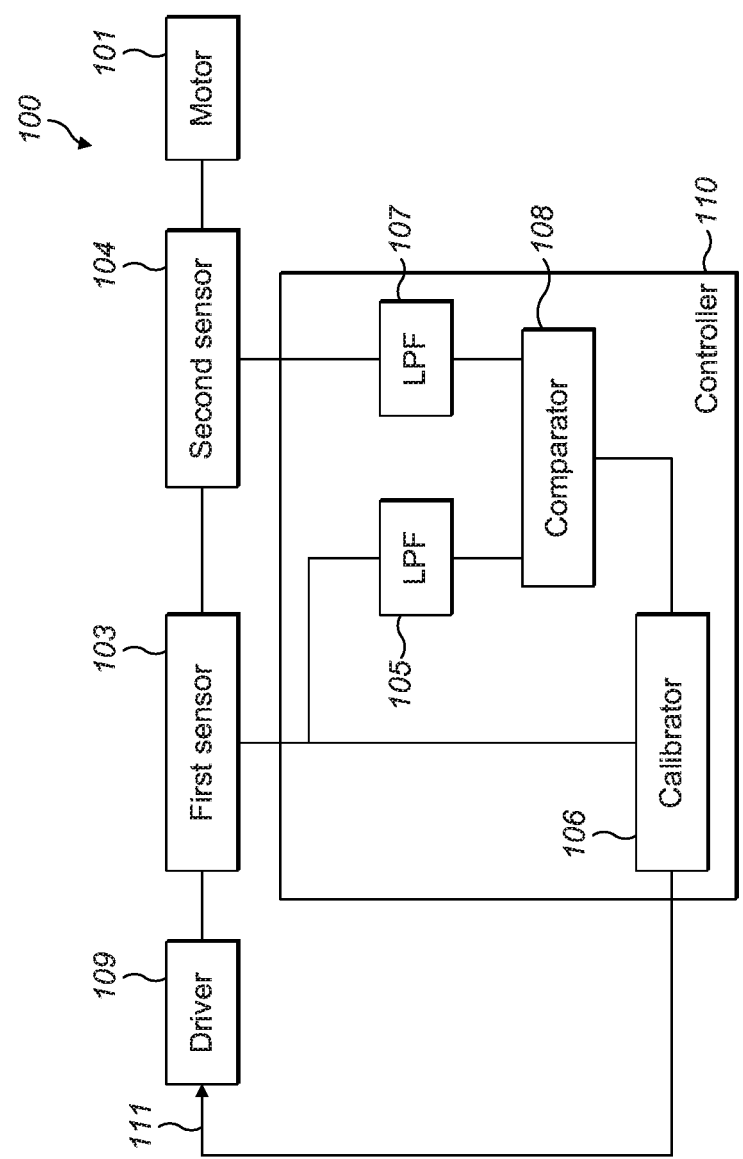
FIG. 1 illustrates a motor control circuit.

FIG. 1 illustrates a motor control circuit 100. Driver 109 generates a current which is output to the motor 101. First current sensor 103 is connected to the motor drive line. In other words, the first current sensor 103 is connected between the output of the driver 109 and the input of the motor 101. Second current sensor 104 is also connected in the motor drive line. In other words, the second current sensor 104 is connected between the output of the driver 109 and the input of the motor 101. The outputs of the first and second current sensors are input to controller 110 which outputs a control signal 111 to driver 109. Within the controller 110, the output of the first current sensor 103 is input to both a low pass filter 105 and a calibrator 106. The output of the second current sensor 104 is input to a low pass filter 107. The outputs of both low pass filters 105 and 107 are connected to the inputs of comparator 108. The output of comparator 108 is also input to calibrator 106. The output of calibrator 106 is the control signal 111.

The first current sensor 103 senses the driving current of the motor to form a first sensed current. Suitably, the first current sensor is a Hall sensor, which operates as previously described. The Hall sensor generates a real-time current measurement. As the driving current changes, the magnetic field it generates changes, and hence the voltage output by the Hall sensor changes. Thus, the current measurement derived from the Hall sensor updates at the frequency of the driving current. This current measurement has a high signal to noise ratio, thus is subject to little filtering. It is therefore accurate at high bandwidths as well as low bandwidths. Thus, the Hall sensor is accurate for measuring high and low speed current signals. However, this current measurement is subject to an offset due to thermal changes in the surroundings of the Hall sensor. This offset changes slowly, i.e. has a low bandwidth. The offset changes with the operating temperature of the circuit board on which the motor is being driven. The temperature of the circuit board may vary from 15° C. to 60° C.

The second current sensor 104 senses the driving current of the motor to form a second sensed current. The second current sensor 104 has greater accuracy versus temperature than the first current sensor. Suitably, the second current sensor 104 is a current sense resistor. Current sense resistors can be produced which are very resistant to changes in the temperature of their surroundings. Thus, their accuracy is not affected by the circuit board on which they are located becoming hot during operation of the motor.

Figure 2:
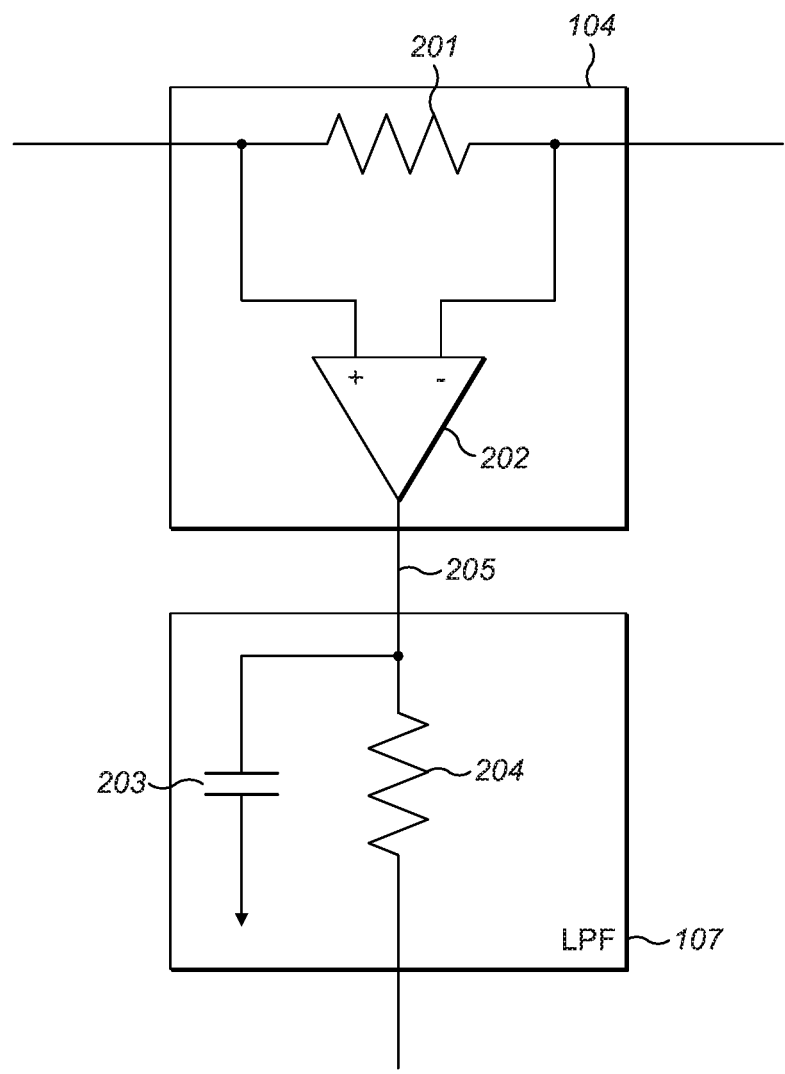
FIG. 2 illustrates an implementation of the second current sensor of FIG. 1.

FIG. 2 illustrates an exemplary current sense resistor 104. Shunt resistor 201 is placed in the motor drive line. Thus, shunt resistor 201 receives the driving current output from the driver 109. The resistor 201 is very small so as to minimise the power dissipated in the resistor. For example, the shunt resistor may have a resistance in the range 0.001Ω to 0.1Ω. The voltage drop across the resistor 201 is measured using an instrumentation amp. Since the resistance, R, of the resistor 201 is constant and known, the second sensed current, I, is determined by I=V/R, where V is the measured voltage drop. Differential amplifier 202 is connected across the resistor 201. In other words, one terminal of resistor 201 is connected to one input of the differential amplifier 202, and the other terminal of resistor 201 is connected to the other input of the differential amplifier 202. Differential amplifier 202 is sensitive to the difference in voltage at the terminals of the resistor 201 not to the absolute value of the voltage at the terminals of the resistor. Thus, the differential amplifier 202 has a high common mode rejection. The differential amplifier 202 generates a differential mode signal 205 which is proportional to the driving current of the motor.

Using a current sense resistor to measure current in this way is an intrusive current sensing mechanism because power is dissipated in the resistor. Thus, the current output from the current sense resistor is lower than that input to it. To limit this, the resistor is very small in size. However, this limits the sensitivity of the current sense resistor. Very small currents cause a very small voltage drop, which is undetectable over the background noise level. Thus, current sense resistors have a low signal to noise ratio, and thus are subject to heavy filtering to achieve an accurate measurement. Current sense resistors are therefore accurate at low bandwidths but not at higher bandwidths. Thus, current sense resistors are accurate for measuring low speed current signals.

The measurement bandwidth of the current sense resistor is small, and low. As the frequency of the current increases, the common mode rejection of the differential amplifier becomes less effective and the signal output by the differential amplifier is no longer proportional to the driving current of the motor. The smaller the resistance of resistor 201, the more pronounced the loss of accuracy of the current measurement. Thus, the operational frequency range over which the current sense resistor is accurate is much lower than the operational frequency range over which the Hall sensor is accurate. Additionally, the frequency of the driving current of the motor is typically outside of the operational frequency range of the current sense resistor. For this reason, the current sense resistor is not suitable for use as a feedback to the driver for motor control.

Thus, the current sense resistor alone is not appropriate to provide an accurate, high speed, non-intrusive, temperature stable motor current measurement utilising only a small footprint.

Returning to FIG. 1, the first sensed current is filtered at low pass filter 105 to form a filtered first sensed current. Similarly, the second sensed current is filtered at low pass filter 107 to form a filtered second sensed current. The pass bands of filters 105 and 107 are the same. Thus, the upper and lower bounds of the frequency sub-band of the filtered first sensed current are the same as those of the frequency sub-band of the filtered second sensed current.

The pass bands of filters 105 and 107 are chosen to be a frequency band that the second sensed current is the most accurate in. Thus, the pass band of the filters 105 and 107 is chosen in dependence on the operational frequency range of the second current sensor. In the case of a current sense resistor, the low pass filters 105 and 107 are configured to attenuate frequencies above a threshold frequency which is that above which the current sense resistor is no longer accurate. For example, this threshold frequency may be ~10 Hz.

The pass bands of filters 105 and 107 may also be chosen in dependence on other factors. For example, a narrower pass band may be selected in a power saving mode of the device in order to reduce the processing power required by the comparator 108 to compare the filtered sensed currents.

FIG. 2 illustrates low pass filter 107 as being implemented by a resistor 204 and a capacitor 203. Capacitor 203 is connected at one end to the output of the differential amplifier 202 and at the other end to ground. The resistor 204 is connected in the signal path of differential mode signal 205 output from the differential amplifier 202. The output of the low pass filter 107 is then input to comparator 108 as shown in FIG. 1. Other suitable low pass filters known to those skilled in the art may be used to implement low pass filters 105 and 107. Typically, these involve two or more of a resistor, inductor and a capacitor, with at least one of these components in the signal path and the other connecting the signal path to ground.

Comparator 108 compares the filtered first sensed current and the filtered second sensed current. The comparator continuously compares these two values during operation of the motor. Suitably, the comparator performs a linear subtraction of its two inputs. Thus, the output of the comparator is the difference between the filtered first sensed current and the filtered second sensed current. Since the filtered second sensed current is accurate over its bandwidth, the offset between the filtered first sensed current and the filtered second sensed current output by the comparator is an instantaneous thermal calibration coefficient suitable for calibrating the whole of the first sensed current for the current temperature conditions. As the temperature changes, the drift of the first sensed current changes. Thus, the comparator dynamically performs the comparison between the filtered first sensed current and the filtered second sensed current in order to output a thermal calibration coefficient specific to the current temperature conditions.

The thermal calibration output from the comparator 108 is input to the calibrator 106. Calibrator 106 applies the thermal calibration signal output from comparator 108 to the first sensed current output from first current sensor 103 to form the sensed driving current. In other words, the thermal calibration signal is applied to the whole of the first sensed current across all its frequency range. The calibrator performs this operation dynamically as the motor is being driven. The calibrator performs the operation in real time. Thus, the sensed driving current is maintained accurate to the current temperature conditions.

In the case of a Hall sensor, the drift of the current measurement with temperature is a linear relationship. Thus, the thermal calibration is a linear offset. The calibrator 106 performs a linear addition of this linear offset and the first sensed current to form the sensed driving current.

The circuitry described in FIG. 1 thus provides an accurate, high speed, non-intrusive, temperature stable motor current measurement utilising only a small footprint.

The sensed driving current is suitably used as part of a feedback loop to control the operation of the motor 101. In FIG. 1, the sensed driving current 111 is used as a control input to driver 109. Driver 109 drives operation of motor 101 in response to the control input 111. For example, if the output sensed current is below a desired value, then the driver 109 may respond by increasing the current input to the motor. Similarly, if the output sensed current is above a desired value, then the driver 109 may respond by decreasing the current input to the motor.

As mentioned above, differential amplifier 202 of current sense resistor 104 of FIG. 2 has a high common mode rejection. It is sensitive to the difference in voltage at the terminals of the resistor 201 not to the absolute value of the voltage at the terminals of the resistor. However, the ability of the differential amplifier 202 to reject the common mode voltage at the terminals of the resistor 201 reduces as that common mode voltage increases. At the high driving currents generated to drive motors, saturation of the differential amplifier may occur. When this happens, the differential mode signal 205 output from the differential amplifier is no longer proportional to the driving current. Thus, the sensed current of the current sense resistor is no longer accurate, even at low frequencies.

Figure 3:
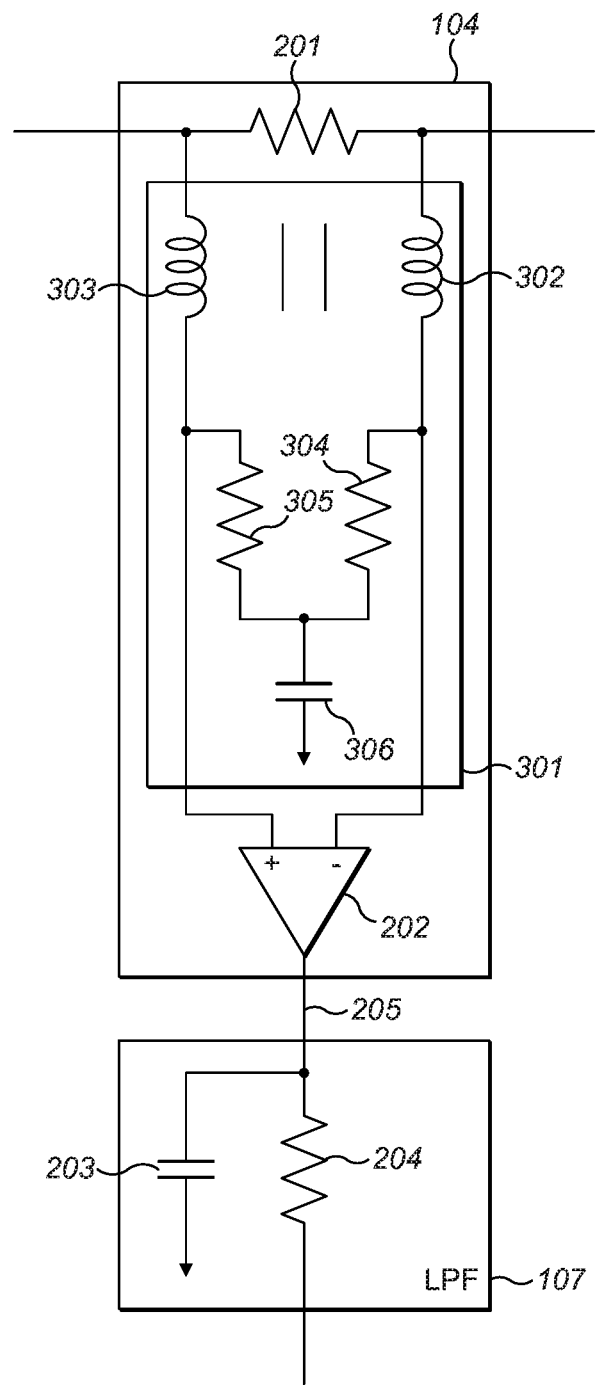
FIG. 3 illustrates a further implementation of the second current sensor of FIG. 1.

FIG. 3 illustrates a further exemplary current sense resistor. Corresponding components to those in FIG. 2 are depicted with the same reference numerals. The description above with reference to FIG. 2 in respect of these corresponding components applies to those components in FIG. 3, and thus is not repeated here. The current sense resistor of FIG. 3 differs from that of FIG. 2 in that it additionally includes a low pass filter 301 connected between the shunt resistor 201 and the differential amplifier 202. The low pass filter 301 has two inputs. One of these inputs is connected to one terminal of resistor 201. The other input is connected to the other terminal of resistor 201. Low pass filter 301 has two outputs. One of these outputs is connected to one input of differential amplifier 202. The other output of low pass filter 301 is connected to the other input of differential amplifier 202. Low pass filter 301 acts to attenuate components common to the inputs of the differential amplifier. Thus, the low pass filter shields the differential amplifier from the common mode signal, and hence increases the amplitude of the driving current that the current sense resistor can withstand before the differential amplifier becomes saturated and loses the ability to output a differential mode signal which is proportional to the driving current. Thus, the current sense resistor of FIG. 3 has an improved common mode rejection compared to the current sense resistor of FIG. 2. The current sense resistor of FIG. 3 can return an accurate sensed current at a higher current than the current sense resistor of FIG. 2.

Any suitable low pass filter may be used as low pass filter 301 of FIG. 3. Suitably, the low pass filter implements the common mode rejection using matched components. FIG. 3 illustrates a low pass filter 301 comprising a common-mode choke. The common-mode choke comprises a pair of inductors 302, 303 wound around a single core and matched resistors 304, 305 as the load. The inductors are matched. Suitably, the inductors have the same number of turns. Suitably, the resistors are matched to 1 part in 1000. The input of one inductor 302 is connected to one terminal of resistor 201. The input of the other inductor 303 is connected to the other terminal of resistor 201. The matched resistors 304,305 are connected in series to the inductors 302,303. The output of one inductor 302 is connected to the input of one of the matched resistors 304. The output of the other inductor 303 is connected to the input of the other one of the matched resistors 305. The outputs of the matched resistors 304,305 are connected together.

This arrangement presents a high impedance to common mode signals. This is because the common mode currents flow in the same direction through each inductor winding, thus the magnetic fields generated are in-phase and add together. The combined inductance of the windings presents a high impedance to the common mode signals. On the other hand, this configuration presents a low impedance to differential mode signals. This is because the differential currents in the inductor windings cancel out. Thus, the differential mode signals are not impeded by the inductor arrangement.

Since the magnetic fields generated by the common mode currents cancel out as a result of the arrangement of the inductor windings, the common-mode choke does not saturate even in high current situations.

Low pass filter 301 optionally further comprises shunt capacitor 306. Shunt capacitor 306 connects the output terminals of the matched resistors 304,305 to ground. The shunt capacitor 306 removes the DC power loss in the matched resistors.

FIG. 1 illustrates the first current sensor 103 being placed in the motor drive line ahead of the second current sensor 104. In other words, the first current sensor 103 receives the output of the driver 109, whereas the second current sensor 104 receives the output of the first current sensor 103. In an alternative arrangement, the second current sensor 104 is placed in the motor drive line ahead of the first current sensor 103. In other words, the second current sensor 104 receives the output of the driver 109, and the first current sensor 103 receives the output of the second current sensor 104.

In a further example, the second current sensor 104 may be an inductive sensor.

The circuitry described herein is suitable for application in any motor control circuit. It may be used, for example, in sensing current in a brushless DC motor control circuit. In this case, the brushless DC motor may have several motor output lines. For example, the motor may be a three-phase motor, for example in a wye or delta winding arrangement. The motor may be a polyphase motor with more than three windings, or it may be a bi-phase motor. Suitably, the circuit of FIG. 1 is implemented on each of the motor drive lines. Thus, the driving current to each winding of the motor is sensed using the dual-sensor method described above. In the case of multiple motor drive lines, different drivers may be used to drive each winding of the motor. In this case, each motor drive line is connected to its own dedicated driver as shown in FIG. 1. Alternatively, the same driver may be used to drive each winding of the motor. That same driver thus receives a feedback loop from each of the motor drive lines. Thus, the same driver receives the sensed driving currents of each of the motor drive lines. The driver may drive the motor drive lines independently. Thus, the driving current for a specific winding is produced by the driver in dependence on the sensed driving current for that winding only. Alternatively, the driver may drive the motor drive lines in dependence on the sensed driving currents for a plurality or all of the sensed driving currents.

The driver may select the current to drive into the motor in dependence on other sensed parameters in addition to the current. For example, one or more of the shaft position, speed and direction of the rotating motor may also be measured, and those measurements fed back to the controller 110 to generate control signals to send to the driver to adjust the operation of the motor.

The driver may select the current to drive into the motor in dependence on inputs other than those sensed and received in a feedback loop. For example, external inputs to change one or more of the direction, speed or torque of the motor may be received by the controller 110. The controller then generates control signals in dependence on these inputs to send to the driver to adjust the operation of the motor.

The currents sensed by the first current sensor and the second current sensor may further be used in a fault detection mechanism. If the first current sensor and second current sensor are operating without a fault, then the difference between the first sensed current and the second sensed current as measured by comparator 108 should solely be caused by the drift of the first current sensor due to the ambient temperature, and any noise which limits the SNR of each of the current sensors. A threshold may be preset which is the cumulative total of the maximum temperature drift and maximum noise errors of each of the current sensors. If the difference between the first sensed current and the second sensed current is greater than this predetermined threshold, then a fault in one or both of the current sensors is considered to have been detected.

Thus, with reference to FIG. 1, a fault detector may receive the thermal calibration output of comparator 108. The fault detector compares the thermal calibration output to the predetermined threshold. If the thermal calibration output is greater than the predetermined threshold, a fault signal is generated. The fault signal indicates that one or both of the first and second current sensors are faulty.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A circuit configured to sense the driving current of a motor, the circuit comprising:
   a driver configured to generate a driving current for a motor;
   a first current sensor configured to sense the driving current thereby forming a first sensed current;

a second current sensor configured to sense the driving current thereby forming a second sensed current, the second current sensor being more thermally stable than the first current sensor;

a comparator configured to compare the first sensed current and the second sensed current below a threshold frequency to generate a thermal calibration output; and a calibrator configured to calibrate the first sensed current by the thermal calibration output to form a sensed driving current.

2. A circuit as claimed in claim 1, wherein the driver is configured to generate the driving current in response to a control input, wherein the control input is the sensed driving current.

3. A circuit as claimed in claim 1, wherein the first current sensor has a higher operational frequency bandwidth than the second current sensor.

4. A circuit as claimed in claim 3, wherein the driving current frequency range is within the operational frequency range of the first current sensor and outside the operational frequency range of the second current sensor.

5. A circuit as claimed in any claim 1, further comprising:
   a first low pass filter configured to attenuate frequencies above the threshold frequency to form a filtered first sensed current; and
   a second low pass filter configured to attenuate frequencies above the threshold frequency to form a filtered second sensed current;
   wherein the comparator is configured to compare the filtered first sensed current and the filtered second sensed current to generate the thermal calibration output.

6. A circuit as claimed in claim 1, wherein the thermal calibration output is a linear offset, and the calibrator is configured to calibrate the first sensed current by adding the linear offset to the first sensed current to form the sensed driving current.

7. A circuit as claimed in claim 1, further comprising a fault detector configured to:
   compare the thermal calibration output to a predetermined threshold; and
   generate a fault signal if the thermal calibration output is greater than the predetermined threshold.

8. A circuit as claimed in claim 1, wherein the second current sensor is a current sense resistor.

9. A circuit as claimed in claim 8, wherein the current sense resistor comprises:
   a shunt resistor connected between the driver and the motor; and
   a differential amplifier connected across the shunt resistor, the differential amplifier configured to generate a differential mode signal proportional to the driving current.

10. A circuit as claimed in claim 9, wherein the current sense resistor further comprises a third low pass filter connected between the shunt resistor and the differential amplifier, the third low pass filter configured to attenuate components common to the inputs to the differential amplifier.

11. A circuit as claimed in claim 10, wherein the third low pass filter comprises a common-mode choke.

12. A circuit as claimed in claim 1, wherein the third low pass filter further comprises a shunt capacitor which connects the common-mode choke to ground.

13. A circuit as claimed in claim 1, wherein the first current sensor is a Hall sensor.

14. A method of sensing the driving current of a motor comprising:
    at a driver, generating a driving current for a motor;
    at a first current sensor, sensing the driving current thereby forming a first sensed current;
    at a second current sensor, sensing the driving current thereby forming a second sensed current, wherein the second current sensor is more thermally stable than the first current sensor;
    generating a thermal calibration output by comparing the first sensed current and the second sensed current below a threshold frequency;
    calibrating the first sensed current by the thermal calibration output to form a sensed driving current.

15. A method as claimed in claim 14, further comprising generating the driving current in response to a control input, wherein the control input is the sensed driving current.

16. A method as claimed in claim 14, wherein the first current sensor has a higher operational frequency bandwidth than the second current sensor.

17. A method as claimed in claim 16, wherein the driving current frequency range of the driver is within the operational frequency range of the first current sensor and outside the operational frequency range of the second current sensor.

18. A method as claimed in claim 14, further comprising:
    at a first low pass filter, attenuating frequencies above the threshold frequency to form a filtered first sensed current;
    at a second low pass filter, attenuating frequencies above the threshold frequency to form a filtered second sensed current; and
    generating the thermal calibration output by comparing the filtered first sensed current and the filtered second sensed current.

19. A method as claimed in claim 14, wherein the thermal calibration output is a linear offset, the method comprising calibrating the first sensed current by adding the linear offset to the first sensed current to form the sensed driving current.

20. A method as claimed in claim 14, further comprising:
    comparing the thermal calibration output to a predetermined threshold; and
    generating a fault signal if the thermal calibration output is greater than the predetermined threshold.

* * * * *